(12) United States Patent  (10) Patent No.: US 7,876,559 B2
Shabbir et al.  (45) Date of Patent: Jan. 25, 2011

(54) UNIVERSAL BLANK FOR AIR FLOW MANAGEMENT

(75) Inventors: Hasnain Shabbir, Round Rock, TX (US); Bernard D. Strmiska, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 276 days.

(21) Appl. No.: 12/272,237

(22) Filed: Nov. 17, 2008

(65) Prior Publication Data

US 2010/0122792 A1  May 20, 2010

(51) Int. Cl.
*H05K 7/20* (2006.01)

(52) U.S. Cl. .................. 361/695; 361/690; 361/692; 361/694; 174/16.1; 165/80.2; 165/80.3; 165/104.33; 454/184

(58) Field of Classification Search .................. None
See application file for complete search history.

(56) References Cited

U.S. PATENT DOCUMENTS

| | | | |
|---|---|---|---|
| 5,063,476 A * | 11/1991 | Hamadah et al. | 361/697 |
| 6,477,044 B2 * | 11/2002 | Foley et al. | 361/695 |
| 6,785,142 B1 * | 8/2004 | Regimbal et al. | 361/727 |
| 7,397,660 B2 * | 7/2008 | Strmiska et al. | 361/679.48 |
| 7,403,383 B2 * | 7/2008 | McGuff et al. | 361/688 |
| 7,474,528 B1 * | 1/2009 | Olesiewicz et al. | 361/695 |
| 7,701,700 B2 * | 4/2010 | Hall et al. | 361/679.33 |
| 7,768,781 B2 * | 8/2010 | Makley et al. | 361/695 |
| 2006/0133036 A1 * | 6/2006 | Durney | 361/695 |

* cited by examiner

*Primary Examiner*—Boris L Chervinsky
(74) *Attorney, Agent, or Firm*—Baker Botts L.L.P.

(57) ABSTRACT

A system for managing air flow through a body of an information handling system is disclosed. The disclosure provides a blank including a blank base plate and a blank ridge extending from the blank base plate. The blank base plate may be configured to match an architecture of both a processor socket and a bank of memory chip sockets. The blank may be configured to provide an impedance to air flow substantially similar to a total impedance provided by a processor and associated heat sink disposed in the processor socket and a bank of memory chips disposed in the bank of memory chip sockets.

20 Claims, 4 Drawing Sheets

UNIVERSAL BLANK FOR AIR FLOW MANAGEMENT

TECHNICAL FIELD

The present disclosure relates in general to the manufacture of information handling systems, and more particularly to a system for managing air flow through a body of an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include one or more microprocessors or other electronic components configured to perform the functions of a central processing unit (CPU). One or more heat sinks may be associated with an electronic component to increase the effective thermal mass and heat dissipation associated with the component. Electronics designers and users may find that a better cooling rate allows increased operating speeds of the components so cooled. Some benefits of increased operating speeds may include, for example, an increase in how quickly and/or efficiently information may be processed, stored, and/or communicated.

Information handling systems may be offered with multiple processor configurations. A platform may offer sockets for two or more processors. Such platforms may be sold with fewer processors actually populating sockets than are available. For example, a dual-processor platform may be sold with only one processor socket populated. Such a platform may be referred to as underpopulated.

An underpopulated platform may present additional challenges in heat dissipation. For example, the platform and associated cooling systems may be designed for optimal operation while fully populated. If a processor socket and/or its associated bank of memory sockets is unpopulated, the air flow through that area of the platform may increase due to the lack of air flow impedance that would be provided by the processor, its associated heat sink, and/or its associated bank of memory chips.

There are available blanks designed to balance air flow through an underpopulated platform. For example, a CPU blank may provide the same airflow impedance as a CPU and its associated heat sink. As another example, a DIMM blank may provide the same airflow impedance as a dual in-line memory module (DIMM). In these examples, one CPU blank must be designed and installed for each empty processor clot plus one DIMM blank for each empty memory chip socket.

For example, FIG. 1 and FIG. 2 depict a prior art system for managing the air flow through a body of an information handling system 1. FIG. 1 is a top view of multiprocessor platform for an information handling system and FIG. 2 is an isometric view of a portion of the platform. Information handling system 1 may include upstream components 2, downstream components 4, processor 10, memory bank 20, processor blank 30, and DIMM blanks 32.

Upstream components 2 may include any electronic and/or mechanical component of information handling system 1 which are upstream of processor 10 and its associated memory chips 20 in reference to the airflow through information handling system 1. Upstream components 2, for example, may include power modules, integrated circuits, electronic components, etc. Downstream components 4 may include any electronic and/or mechanical component of information handling system 1 which are downstream of processor 10 and its associated memory chips 20 in reference to the airflow through information handling system 1. Downstream components 4, for example, may include power modules, integrated circuits, electronic components, etc.

Processor 10 may include any processor configured for use with information handling system 1. Memory bank 20 may include any components configured to facilitate the operation of processor 10. Memory bank 20 may include a set of DIMMs. The individual DIMMs may be secured to information handling system 1 by a bank of memory chip sockets 22.

Processor blank 30 does not perform any electronic functions. Processor blank 30 is tuned to provide the same impedance to air flow as processor 10 and heat sink 12. A processor blank 30 must be uniquely tuned to the particular processor 10 and heat sink 12 and information handling system 1. Each available platform may have unique air flow characteristics based on the shape and form of the chassis, the presence of upstream components 2 and/or downstream components 4, and/or a variety of other aspects. As shown in FIG. 2, processor blank 30 may include a ridge 31 projecting upward and provided some or all of the impedance to airflow of processor blank 30.

Memory blanks 32 do not perform any electronics functions. Memory blanks 32 are tuned to provide the same impedance to air flow as memory bank 20. Memory blanks 32 must be uniquely tuned to the particular memory bank 20 and information handling system 1. Each available platform may have unique air flow characteristics based on the shape and form of the chassis, the presence of upstream components 2 and/or downstream components 4, and/or a variety of other aspects.

SUMMARY

In accordance with the teachings of the present disclosure, a system for managing air flow through a body of an information handling system is disclosed. One embodiment of the system may comprise a blank including a blank base plate and a blank ridge extending from the blank base plate. The blank base plate may be configured to match an architecture of both a processor socket and a bank of memory chip sockets. The blank may be configured to provide an impedance to air flow substantially similar to a total impedance provided by a processor and associated heat sink disposed in the processor socket and a bank of memory chips disposed in the bank of memory chip sockets.

In accordance with another embodiment of the present disclosure, an information handling system is disclosed. The information handling system may comprise a motherboard having multiple processor configurations, a first processor socket having an associated first memory bank, a processor installed in the first processor socket, the processor having an associated heat sink, a second processor socket having an associated second memory bank, and a blank. The blank may include a base plate configured to match the architecture of both the second processor socket and the second memory bank and a ridge extending from the base plate. The ridge may be tuned to provide substantially the same impedance to air flow as the combination of the first processor, the first heat sink, and the first memory bank.

In accordance with another embodiment of the present disclosure, a method for managing air flow through the body of an information handling system may be provided. The method may include assessing the air flow through a memory bank and one or more heat sinks populated on a motherboard, comparing the assessed airflow with airflow through a blank, and tuning the blank to match the airflow through the blank to the assessed airflow.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
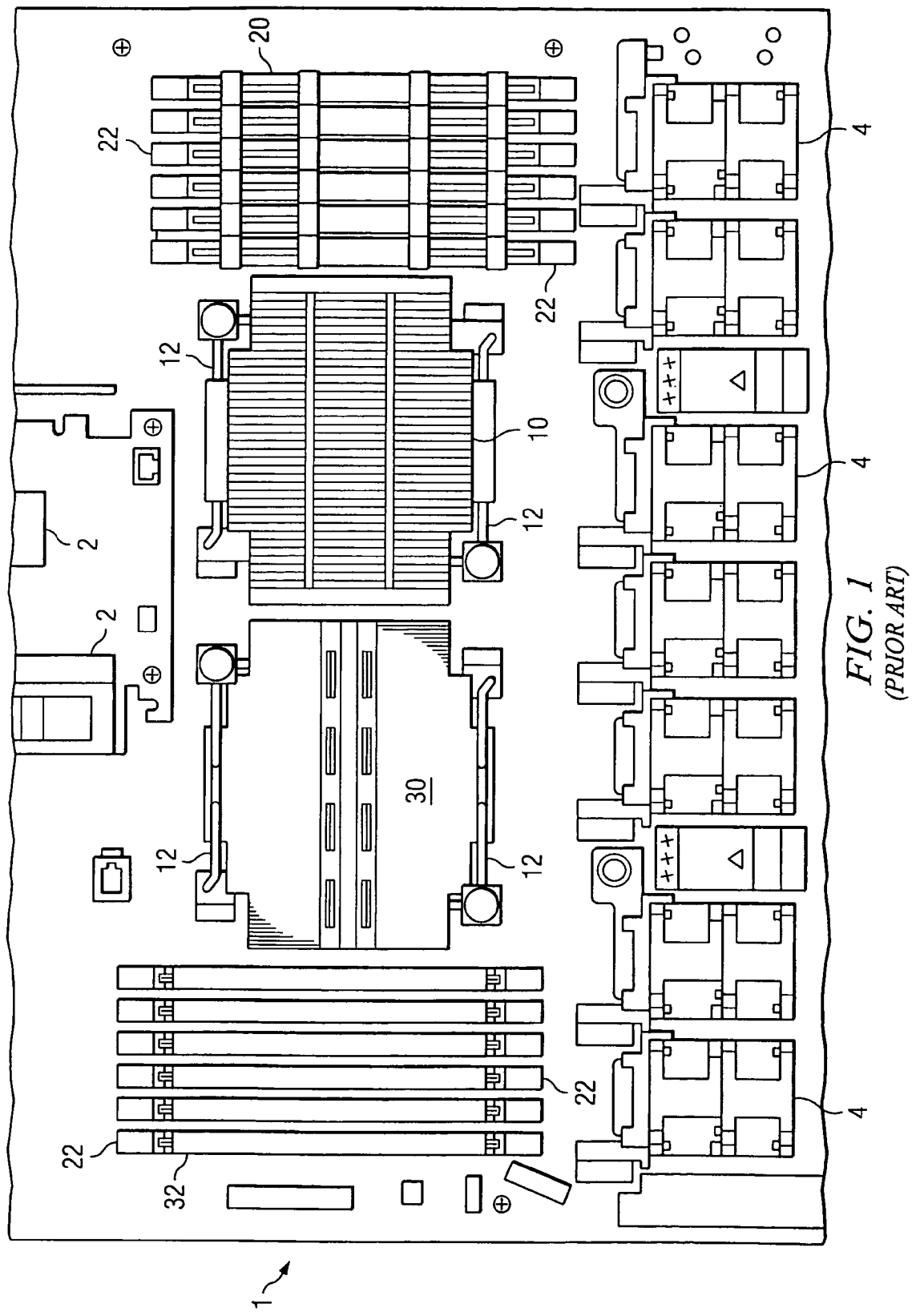
FIG. 1 depicts a prior art system for managing the air flow through a body of an information handling system.
Figure 2:
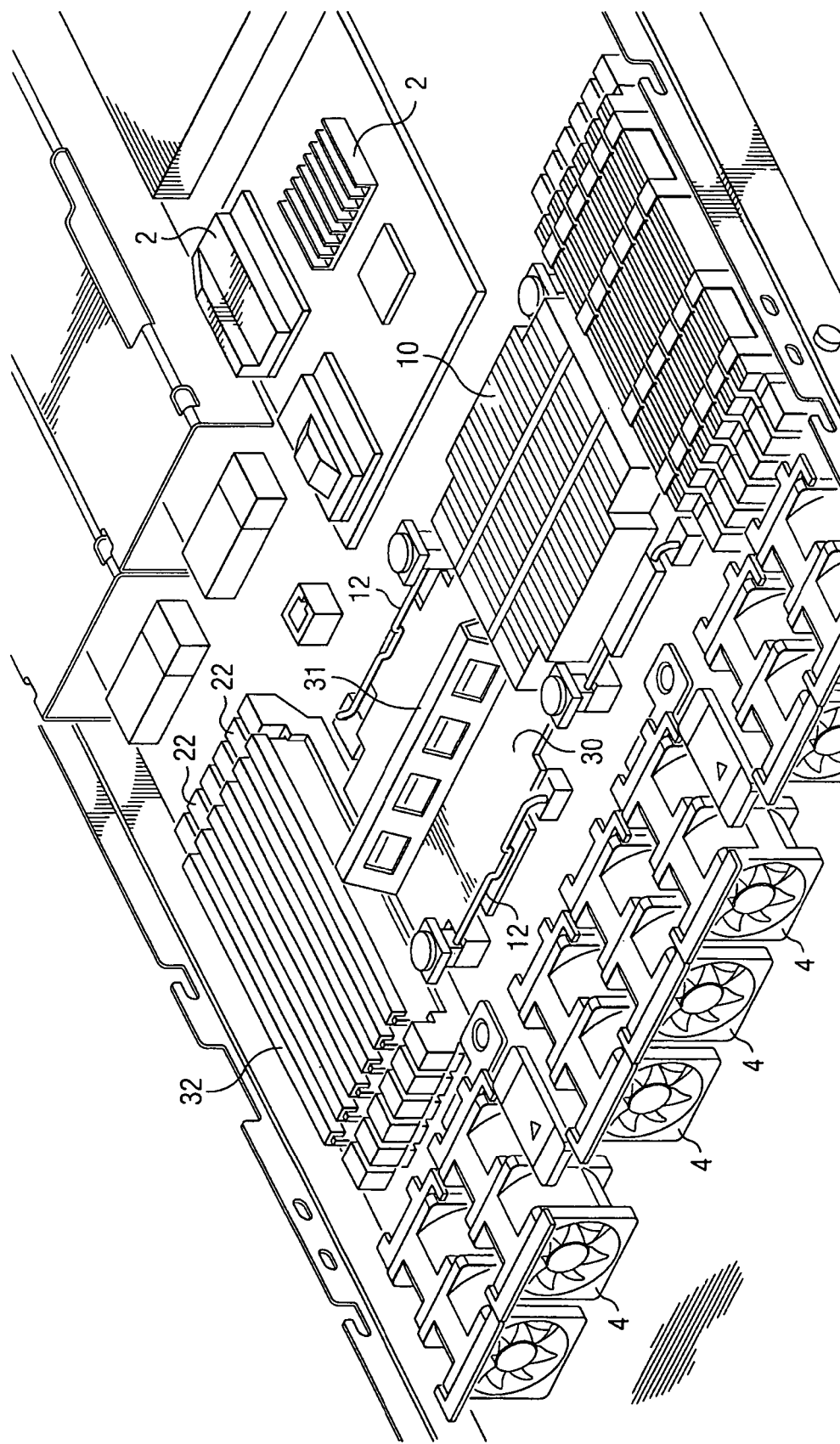
FIG. 2 depicts a prior art system for managing the air flow through a body of an information handling system.
Figure 3:
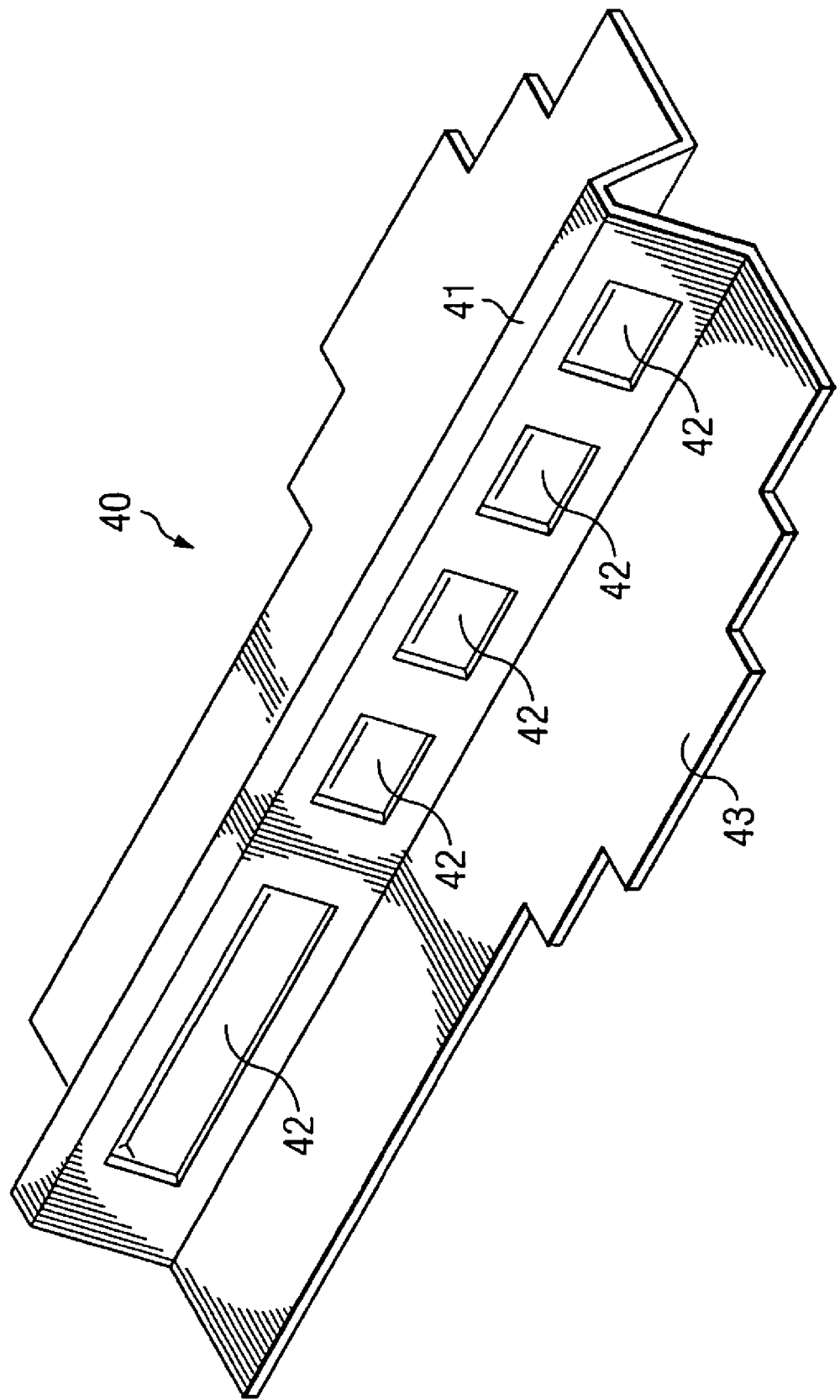
FIG. 3 illustrates a blank for managing air flow through a body of an information handling system in accordance with teachings of the present disclosure.
Figure 4:
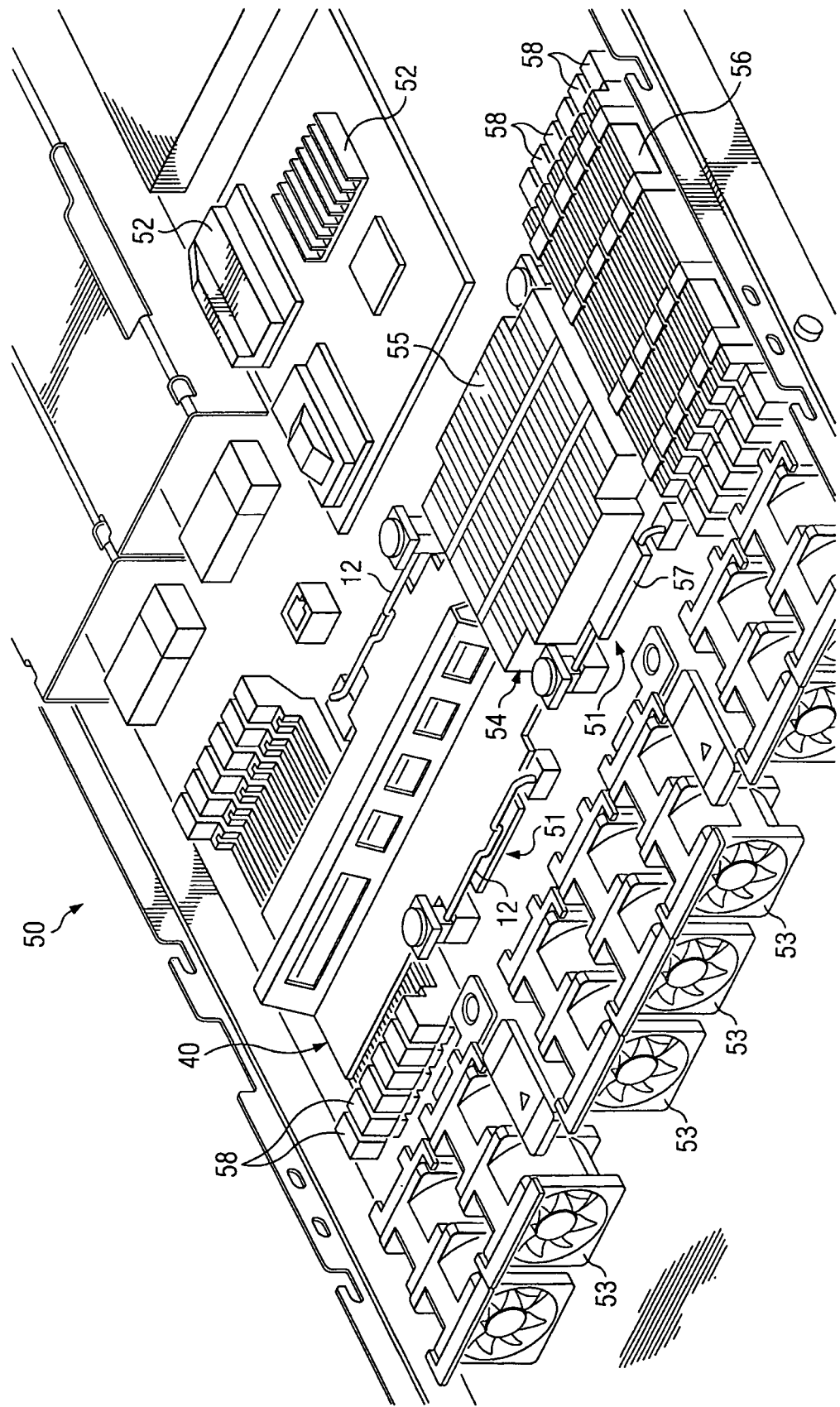
FIG. 4 illustrates a information handling system incorporating a blank for managing air flow through a body of the information handling system in accordance with teachings of the present disclosure.

Preferred embodiments and their advantages are best understood by reference to FIGS. 3 and 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Although the following discussion focuses on systems and methods for managing air flow through the body of an information handling system, it should be understood that the disclosed systems and methods may be similarly applied for managing air flow for any other types of electronic components (e.g., amplifiers, and/or any other heat generating component). Although the following discussion focuses on systems or methods in light of a user, it should be understood that the disclosed systems and methods may be similarly applied by an automated device or system.

FIG. 3 illustrates a blank 40 for managing air flow through a body of an information handling system 50 in accordance with teachings of the present disclosure. Blank 40 may include a blank ridge 41 and a blank base plate 43. Blank ridge 41 may extend from blank base plate 43. Blank base plate 43 may be configured to match an architecture of both a processor socket and a bank of memory chip sockets. As an example, blank base plate 43 may be configured to rest on top of a processor socket and a bank of memory chip sockets.

Further, blank 40, including the features of blank ridge 41 and blank base plate 43, may be configured to provide an impedance to air flow substantially similar to a total impedance provided by (a) a processor and its associated heat sink disposed in processor socket and (b) a bank of memory chips disposed in a bank of memory chip sockets. The configuration of blank 40 may be adjusted, for example, by changing the height and/or contour of blank ridge 41, and/or by changing the number, size, shape, or other feature of holes 42.

Bank base plate 43 may be configured to cover both a processor socket 52 and a bank of memory sockets 58 associated with information handling system 50 (shown in FIG. 4). For example, processor socket 51 may include any device or component configured to provide an electrical connection between a CPU and the circuitry present on a board, as well as a physical connection between the CPU and the board. For example, processor socket 51 may include a CPU socket and/or CPU slot.

In some embodiments, processor socket 51 may include a lever 57 or other component operable to provide a releasable physical connection as desired. Such a feature may allow for "zero insertion force" operation. For example, the socket may include a known "socket 478", "socket T", or any of the many CPU sockets provided to interface with one or more available CPUs. In these and similar embodiments, blank plate 43 may be configured to connect to processor socket 51 using lever 57.

In some embodiments, processor socket 51 may include a set of electrical connectors operable to connect circuitry of the CPU to the circuitry of the board. For example, the socket may include a ball grid array. In some embodiments, the socket may include a fine ball grid array, a plastic ball grid array, a land grid array, a pin grid array, a dual in-line surface mount, and/or any other method of providing electrical connections between circuitry of information handling system 50 and any circuitry of the CPU. In any of these or similar embodiments, blank plate 43 may be configured to interface with and/or protect the components of processor socket 51.

Blank 40 may be used to manage the air flow through an underpopulated processor platform. In contrast to solutions using multiple memory blanks and processor blanks, blank 40 may provide a single unitary blank body. For example, a solution using multiple DIMM blanks results in individual installation of a DIMM blank for each empty memory slot. In some double processor servers, this solution may require a processor blank and nine DIMM blanks. In contrast, blank 40 may be used to manage the air flow through an information handling system and require a single installation. Blank 40 may reduce inventory part counts, factory handling steps, manufacturing steps, and other benefits. For example, a DIMM blank that is held by memory sockets.

Blank ridge 41 may be configured to allow stacking of two or more blanks 40. For example, blank ridge 41 may include a hollow triangle, allowing the blank ridge of a first blank to rest within the blank ridge of the second blank. Stackable blanks 40 may allow several blanks 40 to be stored in a smaller volume than unstackable blanks 40.

FIG. 4 illustrates a information handling system incorporating blank 40 for managing air flow through the body of information handling system 50 in accordance with teachings of the present disclosure. Some embodiments of blank 40 may be configured for mounting opposite a populated processor socket 51. As shown in FIG. 4, information handling system 50 may include a processor 54 and an associated heat sink 55 as well as a bank of memory chips 56 in a bank of memory chip sockets 58. In other embodiments, information handling system 50 may include any underpopulated platform (e.g., two processors in a four socket platform, one processor in a two socket platform, etc.).

Information handling system 50 may include upstream components 52 and/or downstream components 53. Upstream components 52 may include any electronic and/or mechanical component of information handling system 50 which are upstream of processor 54 and its associated memory chips 56 in reference to the airflow through information handling system 50. Upstream components 52, for example, may include power modules, integrated circuits, electronic components, etc. Downstream components 53 may include any electronic and/or mechanical component of information handling system 50 which are downstream of processor 51 and its associated memory chips 56 in reference to the airflow through information handling system 50. Downstream components 53, for example, may include power modules, integrated circuits, electronic components, etc.

Processor 54 may include a central processing unit (CPU) and/or any machine, device, or component configured to perform or execute computer programs. Information handling system 50 may include one or more processors 54 configured to execute a set of instructions stored in a memory device and/or component.

Heat sink 55 may include any device or component configured to increase the thermal mass of processor 54. For example, in embodiments such as that shown in FIG. 4, heat sink 55 may include a thermal mass, and one or more fins. Heat sink 55 may be formed from any appropriate material or component configured to increase heat transfer away from processor 54. For example, heat sink 55, when associated with processor 54, may serve to increase the effective thermal mass and heat dissipation associated with processor 54. Heat sink 55 may include a mass with relatively high thermal conductivity (e.g., a metal block or aluminum and/or copper alloy).

Heat sink 55 may be fabricated and/or shaped in any manner to facilitate heat transfer between processor 54 and heat sink 55 and/or to facilitate mounting heat sink 55 to associated hardware in information handling system 50. Heat sink 55 may include any component (e.g., fins) configured to increase heat transfer from heat sink 55 to the environment. A set of fins may serve to increase the surface area of heat sink 55 and, therefore, increase the rate of heat transfer through convection, conduction, and/or radiation between heat sink 55 and the environment. A set of fins may include any physical features or characteristics that tend to increase the surface area-to-volume ratio of heat sink 55.

Memory chips 56 may be any device, component, and/or feature of information handling system 50 cooperating with processor 54 to perform one or more functions. For example, memory chips 56 may include one or more dual in-line memory modules (DIMM) or single in-line memory modules (SIMM). As other examples, memory chips 56 may include RAM, DRDRAM, RDRAM, ZIP, SIP, and/or DIP. Memory chips 56 may include volatile or non-volatile memory.

Memory chip sockets 58 may include any device and/or component configured to receive and/or retain a memory chip. For example, memory chip sockets 58 may include DDR, DDR SODIMM, DDR2 FBDIMM, DDR2 LPDIMM, DDR2 SODIM, DIMM, and/or SODIMM connectors.

Blank 40 may be customized for any given server platform or configuration of information handling system 50. The specific air flow impedance of blank 40 may provide improved air flow to other components of information handling system 50 (e.g., upstream components 52, downstream components 53, processor 54, heat sink 55, and/or memory chips 56). Improved air flow to other components may provide reduced power consumption (e.g., through reduced fan duty cycle and/or reduced fan size).

Persons having skill in the art will recognize several methods for configuring blank 40 (e.g., tuning the impedance provided). For example, FLOWTHERM® may be used to simulate the heat transfer and/or airflow over components of information handling system 50 and blank 40. As another example, experimentation on a flow bench may allow a user to tune the configuration of blank 40 to provide an impedance substantially similar to the total impedance provided by processor 54 in processor socket 51 and memory chips 56 in memory sockets 58.

Information handling system 50 may operate without blank 40, but the lack of impedance over the empty processor socket and bank of memory sockets would starve processor 54 and memory chips 56. On the other hand, blocking air flow across an unpopulated socket would starve any downstream components 53 located downstream of the blocked air flow.

Tuning the impedance of blank 40 may provide for a standardized universal blank for air flow management. Using the teachings of the present disclosure may reduce and/or eliminate the need to stock individual blanks for each processor/heat sink combination and each memory chip. In addition, a universal blank may reduce the number of components installed in the manufacturing process.

In addition, a universal blank may not require separate blanks for each unpopulated memory socket 58 present in information handling system 50. Blank 40 may be configured to rest on top of unpopulated memory sockets 58 rather than plugging into each memory socket 58. A blank that plugs into a socket, whether processor socket 51 or memory socket 58, may require manufacturing labor and/or risk damage to the socket in question.

Although the figures and embodiments disclosed herein have been described with respect to processors and information handling systems, it should be understood that various changes, substitutions and alternations can be made herein without departing from the spirit and scope of the disclosure as illustrated by the following claims. For instance, the teachings of the present disclosure may be applied to other electronics components such as amplifiers and may be applied to other systems such as consumer kitchen appliances, stereos, and/or any system incorporating high performance electronics components.

What is claimed is:

1. A blank for managing air flow through a body of an information handling system, the blank comprising:
   a blank base plate configured to match an architecture of both a processor socket and a bank of memory chip sockets; and
   a blank ridge extending from the base plate;
   wherein the blank is configured to provide an impedance to air flow substantially similar to a total impedance provided by (a) a processor and associated heat sink disposed in the processor socket and (b) a bank of memory chips disposed in the bank of memory chip sockets.

2. A blank according to claim 1, wherein the bank of memory chip sockets include dual in-line memory module sockets.

3. A blank according to claim 1, wherein the processor socket includes a zero insertion force socket.

4. A blank according to claim 1, further comprising a connector configured to mate with a lever associated with the processor socket and retain the blank in place against the processor socket.

5. A blank according to claim 1, wherein the blank base plate is configured to rest on top of the processor socket and the bank of memory chip sockets.

6. A blank according to claim 1, wherein the blank ridge is configured to allow a stack of multiple blanks.

7. An information handling system comprising:
   a motherboard having multiple processor configurations;
   a first processor socket having an associated first memory bank;
   a processor installed in the first processor socket, the processor having an associated heat sink;
   a second processor socket having an associated second memory bank; and
   a blank comprising:
      a base plate configured to match the architecture of both the second processor socket and the second memory bank; and
      a ridge extending from the base plate;
      wherein the ridge is tuned to provide substantially the same impedance to air flow as the combination of the first processor, the first heat sink, and the first memory bank.

8. An information handling system according to claim 7, wherein the first memory bank includes a dual in-line memory module.

9. An information handling system according to claim 7, wherein the second processor socket includes a zero insertion force socket.

10. An information handling system according to claim 7, wherein the blank further comprises a connector configured to mate with a lever associated with the second processor socket and retain the blank in place against the second processor socket.

11. An information handling system according to claim 7, wherein the blank base plate is configured to rest on top of the processor socket and the bank of memory chip sockets.

12. An information handling system according to claim 7, wherein the blank ridge is configured to allow a stack of multiple blanks.

13. A method for managing air flow through the body of an information handling system, the method comprising:
   assessing the air flow through a memory bank and one or more heat sinks populated on a motherboard;
   comparing the assessed airflow with airflow through a blank; and
   tuning the blank to match the airflow through the blank to the assessed airflow.

14. A method according to claim 13, further comprising installing the blank in the information handling system.

15. A method according to claim 13, further comprising installing the blank in the information handling system opposite the memory bank and the one or more heat sinks populated on the motherboard.

16. A method according to claim 13, further comprising installing the blank to cover an unpopulated processor socket and an unpopulated bank of memory sockets.

17. A method according to claim 13, wherein the one or more heat sinks are associated with a central processing unit populated on a motherboard.

18. A method according to claim 13, wherein the memory bank includes one or more DIMMs.

19. A method according to claim 13, wherein the blank includes a blank base plate configured to rest on top of a processor socket and a bank of memory sockets.

20. A method according to claim 13, further comprising configuring the blank to include a blank ridge allowing a stack of multiple blanks.

* * * * *